US007053530B2

(12) United States Patent
Baumgartner et al.

(10) Patent No.: US 7,053,530 B2
(45) Date of Patent: May 30, 2006

(54) METHOD FOR MAKING ELECTRICAL CONNECTION TO ULTRASONIC TRANSDUCER THROUGH ACOUSTIC BACKING MATERIAL

(75) Inventors: Charles E Baumgartner, Niskayuna, NY (US); Robert S Lewandowski, Amsterdam, NY (US)

(73) Assignee: General Electric Company, Niskayuna, NY (US)

(*) Notice: Subject to any disclaimer, the term of this patent is extended or adjusted under 35 U.S.C. 154(b) by 273 days.

(21) Appl. No.: 10/065,813

(22) Filed: Nov. 22, 2002

(65) Prior Publication Data

US 2004/0100163 A1 May 27, 2004

(51) Int. Cl.
*H01L 41/08* (2006.01)

(52) U.S. Cl. .................................................... 310/334

(58) Field of Classification Search ................ 310/334, 310/322, 326, 327, 311; 128/66.23; 600/437, 600/659, 447; 367/173–174, 140, 162; H01L 41/04
See application file for complete search history.

(56) References Cited

U.S. PATENT DOCUMENTS

| | | | | |
|---|---|---|---|---|
| 5,103,129 | A * | 4/1992 | Slayton et al. | 310/335 |
| 5,267,221 | A | 11/1993 | Miller et al. | |
| 5,297,553 | A * | 3/1994 | Sliwa et al. | 310/334 |
| 5,406,163 | A * | 4/1995 | Carson et al. | 310/334 |
| 5,493,541 | A | 2/1996 | Snyder | |
| 6,043,590 | A | 3/2000 | Gilmore | |
| 6,266,857 | B1 | 7/2001 | Corbett, III et al. | |
| 6,276,211 | B1 * | 8/2001 | Smith | 600/447 |
| 6,537,220 | B1 * | 3/2003 | Friemel et al. | 600/447 |
| 6,659,954 | B1 * | 12/2003 | Robinson | 600/459 |
| 6,759,791 | B1 * | 7/2004 | Hatangadi et al. | 310/334 |

FOREIGN PATENT DOCUMENTS

| | | |
|---|---|---|
| WO | WO 02/40184 | 11/2001 |

* cited by examiner

*Primary Examiner*—Darren Schuberg
*Assistant Examiner*—Karen Beth Addison
(74) *Attorney, Agent, or Firm*—Jean K. Testa; Christian G. Cabou

(57) ABSTRACT

In an ultrasonic transducer, the transducer elements are electrically connected to the pulsers via throughholes in an acoustic backing layer. Electrically conductive material is deposited on the front face of the acoustic backing layer and later diced to form conductive pads, and on the walls of the throughholes or vias to form conductive traces having exposed ends that will be connected later to a printed circuit. The holes in the acoustic backing layer are then filled with acoustic attenuative material. The signal electrodes on the rear faces of the transducer elements are electrically connected to the printed circuit via the conductive pads and the conductive traces of the acoustic backing layer. A common ground connection is disposed between the front faces of the transducer elements and the acoustic impedance matching layer, which ground connection exits the transducer pallet from the side.

17 Claims, 4 Drawing Sheets

METHOD FOR MAKING ELECTRICAL CONNECTION TO ULTRASONIC TRANSDUCER THROUGH ACOUSTIC BACKING MATERIAL

BACKGROUND OF INVENTION

This invention generally relates to methods and devices for making electrical connections to ultrasonic transducers. In particular, the invention relates to methods for making electrical connections to ultrasonic transducer elements through an acoustic backing layer.

A typical ultrasound probe consists of three basic parts: (1) a transducer package; (2) a multi-wire coaxial cable connecting the transducer to the rest of the ultrasound system; and (3) other miscellaneous mechanical hardware such as the probe housing, potting material and electrical shielding. The transducer package is typically produced by stacking layers in sequence.

In one type of known transducer stack, a flexible printed circuit board (hereinafter "flex circuit"), having a plurality of conductive traces connected in common to an exposed bus, is bonded to a metal-coated rear face of a large piezoelectric ceramic block. The bus of the flex circuit is bonded and electrically coupled to the metal-coated rear face of the piezoelectric ceramic block. In addition, a conductive foil is bonded to a metal-coated front face of the piezoelectric ceramic block to provide a ground path for the ground electrodes of the final transducer array. The conductive foil must be sufficiently thin to be acoustically transparent, that is, to allow ultrasound emitted from the front face of the piezoelectric ceramic block to pass through the foil without significant attenuation. The conductive foil extends beyond the area of the transducer array and is connected to electrical ground.

Next, a first acoustic impedance matching layer is bonded to the conductive foil. This acoustic impedance matching layer has an acoustic impedance less than that of the piezoelectric ceramic. Optionally, a second acoustic impedance matching layer having an acoustic impedance less than that of the first acoustic impedance matching layer is bonded to the front face of the first matching layer. The acoustic impedance matching layers transform the high acoustic impedance of the piezoelectric ceramic to the low acoustic impedance of the human body and water, thereby improving the coupling with the medium in which the emitted ultrasonic waves will propagate.

To fabricate a linear array of piezoelectric transducer elements, the top portion of this stack is then "diced" by sawing vertical cuts, i.e., kerfs, that divide the piezoelectric ceramic block into a multiplicity of separate side-by-side transducer elements. During dicing, the bus of the flex circuit is cut to form separate terminals and the metal-coated rear and front faces of the piezoelectric ceramic block are cut to form separate signal and ground electrodes respectively. Electrically and acoustically isolated, the individual elements can now function independently in the array. Although the conductive foil is also cut into parallel strips, these strips are connected in common to the conductive foil portion that extends beyond the transducer array, which conductive foil portion forms a bus that is connected to ground. Alternatively, the flex circuit can be formed with individual terminals instead of a bus and then bonded to the piezoelectric transducer array after dicing.

The transducer stack also comprises a mass of suitable acoustical damping material having high acoustic losses. This backing layer is coupled to the rear surface of the piezoelectric transducer elements to absorb ultrasonic waves that emerge from the back side of each element so that they will not be partially reflected and interfere with the ultrasonic waves propagating in the forward direction.

A known technique for electrically connecting the piezoelectric elements of a transducer stack to a multi-wire coaxial cable is by a flex circuit having a plurality of etched conductive traces extending from a first terminal area to a second terminal area in which the conductive traces fan out, i.e., the terminals in the first terminal area have a linear pitch greater than the linear pitch of the terminals in the second terminal area. The terminals in the first terminal areas are respectively connected to the individual wires of the coaxial cable. The terminals in the second terminal areas are respectively connected to the signal electrodes of the individual piezoelectric transducer elements.

As the system demands on element count in these devices increase, the requirements for making electrical connection to new complex transducer geometries become more demanding. In particular, the density requirements of the transducer array are challenged by the transducers needed for multi-dimensional imaging. These transducers require elements in two dimensions, instead of the one-dimensional designs required by conventional imaging apparatus. When the electrical interconnect becomes two-dimensional, however, the designer is faced with the challenge of providing an electrical interconnect for transducer elements which are no longer accessible from the sides of the array, which is a feature common to most conventional transducer designs. More specifically, in the case of an array of three or more rows of transducer elements, one or more rows are in the interior of the array with access blocked by the outermost rows of the array. In order to connect the internal elements, complicated methods have been proposed and developed. One solution, embodied in diverse transducer designs, is to make electrical connections through the acoustic backing layer of the transducer stack.

The acoustic backing layer or plate is typically made of acoustically attenuating material that dampens the acoustic energy generated by the piezoelectric transducer in the direction away from the patient being scanned. An acoustic backing layer is typically cast from epoxy mixed with acoustic absorbers and scatterers, such as small particles of tungsten or silica or air bubbles. The mixtures of these materials must be controlled to give the acoustic backing layer a desired acoustic impedance and attenuation. This acoustic attenuation, along with the acoustic impedance, affects transducer performance parameters such as bandwidth and sensitivity. Therefore, the acoustic properties of the backfill material must be tailored to optimize the acoustic stack design. Meanwhile, the backfill material must also provide both mechanical support for the diced transducer array and, in the case of a two-dimensional array, allow for electrical connectivity to each of the individual transducer elements. The addition of the latter requirement for two-dimensional arrays presents some a typical constraints on the design and manufacturability of the acoustic backing layer. Electrical connectivity must be achieved through the acoustically attenuating material in such a manner as to prevent element-to-element electrical crosstalk. Meanwhile the electrical connector must also displace a minimal volume percentage of the acoustically attenuating material in order for the overall acoustic design of the system to be maintained.

U.S. Pat. No. 5,267,221 describes an acoustically attenuating material that contains conductive elements aligned in one direction through the acoustic material to provide electrical connectivity between a diced transducer array and an electrical circuit. The block of acoustically attenuating material spanned by the electrical conductors may be either homogeneous or heterogeneous in composition. The electrical conductors embedded within the acoustic material may be wires, insulated wires, rods, flat foil, foil formed into tubes or woven fabric. This patent also discloses forming a thin metal coating on cores made of acoustic backing material. Electrical contact to the transducer array interface may be at one or multiple locations on the array face.

A second approach for obtaining a composite acoustically attenuating material is described in U.S. Pat. No. 6,043,590, which teaches an acoustic backing block comprised of a metallized flex circuit possessing conductive traces embedded within an acoustically attenuating material.

A different approach is taken in U.S. Pat. No. 6,266,857, which discloses the formation of a set of vias and indented pad seats in an acoustically attenuating backing layer, e.g., by means of laser machining. The machined substrate is then plated with an electrically conductive material. Excess electrically conductive material is removed from the substrate to leave electrically conductive material plated on the indented pad seats and the vias, thereby forming conductive pads and plated vias, the latter constituting conductive traces that penetrate the substrate in the thickness direction. In addition, vias are formed in the piezoceramic layer and plated, these plated vias being aligned with and electrically connected to those plated vias in the backing layer that are connected to ground. This arrangement allows the electrical connection of ground electrodes on the front surface and signal electrodes on the rear surface of the transducer element array to a flex circuit on the back surface of the backing layer.

There is a continuing need for two-dimensional ultrasonic transducer arrays of improved design with electrical connection through the acoustic backing layer.

SUMMARY OF INVENTION

The invention is directed in part to an ultrasonic transducer having an acoustic backing comprised of an acoustically attenuative material possessing an electrically conducting plane on at least one face and an electrically conducting path through the body of the acoustic backing material. The conductor thicknesses on the surface and through the body are sufficiently small that they present a minimal impact on the overall acoustic properties. The conductive face joins against the transducer elements, allowing for easy contact to each transducer pixel, and is separated into discrete elements during array dicing following assembly.

One aspect on the invention is a method of manufacture comprising the following steps: forming a preform of acoustic backing material having an array of holes that pass through the preform from one side to the other; depositing an electrically conducting film onto at least one face of the acoustic backing preform and onto the surfaces of the holes that span the acoustic backing material; filling the remaining volume inside the holes with acoustic backing material; mounting the resulting layer of acoustic backing material onto a transducer array; and electrically separating each transducer element to allow for individual electrical connection.

Another aspect of the invention is a method of manufacturing an ultrasonic transducer comprising the following steps: (a) forming an array of holes in a relatively thick layer of acoustically attenuative material having front and rear faces, each hole spanning the thickness of the body from the front face to the rear face thereof; (b) depositing a first relatively thin layer of electrically conductive material on at least the front face of the relatively thick layer and on the surfaces of the holes; (c) filling the remaining volume of the holes with acoustically attenuative material; (d) depositing a second relatively thin layer of electrically conductive material on a rear face of a layer of piezoelectric material; (e) laminating the relatively thick layer of acoustically attenuative material to the layer of piezoelectric material with the first and second relatively thin layers of electrically conductive material electrically connected; and dicing the layer of piezoelectric material and a portion of the relatively thick layer of acoustically attenuative material along a plurality of mutually parallel planes to a sufficient depth to form a plurality of kerfs that electrically isolate a plurality of regions of the first and second relatively thin layers from each other.

A further aspect of the invention is a method of manufacturing an ultrasonic transducer comprising the following steps: (a) forming a mold having a plurality of columns; (b) depositing a first relatively thin layer of electrically conductive material on the inner surfaces of the mold, including the peripheral surfaces of the columns; (c) casting acoustically attenuative material in the mold to form a relatively thick layer of the acoustically attenuative material joined to the first relatively thin layer of electrically conductive material, with an array of holes formed by the plurality of columns; (d) removing the mold while leaving the first relatively thin layer of electrically conductive material joined to the relatively thick layer of the acoustically attenuative material; (e) filling the remaining volume of the holes with acoustically attenuative material; (f) depositing a second relatively thin layer of electrically conductive material on a rear face of a layer of piezoelectric material; (g) mounting the relatively thick layer of acoustically attenuative material to the layer of piezoelectric material with the first and second relatively thin layers of electrically conductive material in contact with each other; and (h) dicing the layer of piezoelectric material and a portion of the relatively thick layer of acoustically attenuative material along a plurality of mutually parallel planes to a sufficient depth that a plurality of regions of the second relatively thin layer on the rear face of the layer of piezoelectric material are electrically isolated from each other and a corresponding plurality of regions of the first relatively thin layer on the front face of the relatively thick layer of acoustically attenuative material are electrically isolated from each other by a plurality of kerfs.

Yet another aspect of the invention is an ultrasonic transducer comprising an array of piezoelectric transducer elements and an acoustic backing layer acoustically coupled to the rear face of each of the piezoelectric transducer elements, the acoustic backing layer comprising a layer of acoustically attenuative material with a plurality of via-shaped internal structures, each of the via-shaped internal structures having a deposit of electrically conductive material thereon and bounding a volume filled with acoustically attenuative material.

A further aspect of the invention is an ultrasonic transducer comprising: an acoustic backing layer made of acoustically attenuative material; a array of ultrasonic transducer elements that generate ultrasound waves in response to electrical excitation, each ultrasonic transducer element having a rear face acoustically coupled to a respective region of a front face of the acoustic backing layer; a array of acoustic matching layer elements, each ultrasonic transducer element having a front face acoustically coupled to a respective acoustic matching layer element; a common ground connection made of electrically conductive material and disposed between the array of ultrasonic transducer elements and the array of acoustic matching layer elements; and a plurality of electrical conductors that pass through the acoustic backing layer. The front and rear faces of the ultrasonic transducer elements have deposits of electrically conductive material thereon. Each of the electrical conductors comprises a respective conductive pad formed on the front face of the acoustic backing layer and in electrical contact with an opposing rear face of a respective ultrasonic transducer element, and further comprises a respective conductive trace deposited on a respective via-shaped structure in the acoustic backing layer, connected to a respective one of the conductive pads and exposed at a rear face of the acoustic backing layer. No part of the common ground connection passes through the acoustic backing material.

Other aspects of the invention are disclosed and claimed below.

BRIEF DESCRIPTION OF DRAWINGS

FIG. 2 is a drawing showing a top view of a bar- or plate-shaped body of acoustically attenuative material having holes that pass through the thickness of the body.

FIG. 3 is a drawing showing a sectional view of the acoustically attenuative body depicted in FIG. 2, the section being taken along line 33 indicated in FIG. 2.

FIG. 4 is a drawing showing a sectional view of the acoustically attenuative body depicted in FIG. 3 after electrically conductive material is deposited on the front face and in the throughholes.

FIG. 5 is a drawing showing a sectional view of the acoustically attenuative body depicted in FIG. 4 after the throughholes (with electrically conductive material deposited thereon) are filled with acoustically attenuative material.

FIG. 6 is a drawing showing a top view of the acoustically attenuative body depicted in FIG. 5, after the top stratum of the body is diced along mutually orthogonal directions.

FIG. 7 is a drawing showing a sectional view of the acoustically attenuative body depicted in FIG. 6, the section being taken along line 77 indicated in FIG. 6.

DETAILED DESCRIPTION

The present invention is directed to an acoustic backing layer for a multi-row two-dimensional transducer array and a method for manufacturing such an acoustic backing layer. The backing material possesses acoustic attenuation properties sufficient to allow for optimal acoustic stack design plus electrical connectivity through the backing layer to each individual element of the transducer array.

Figure 1:
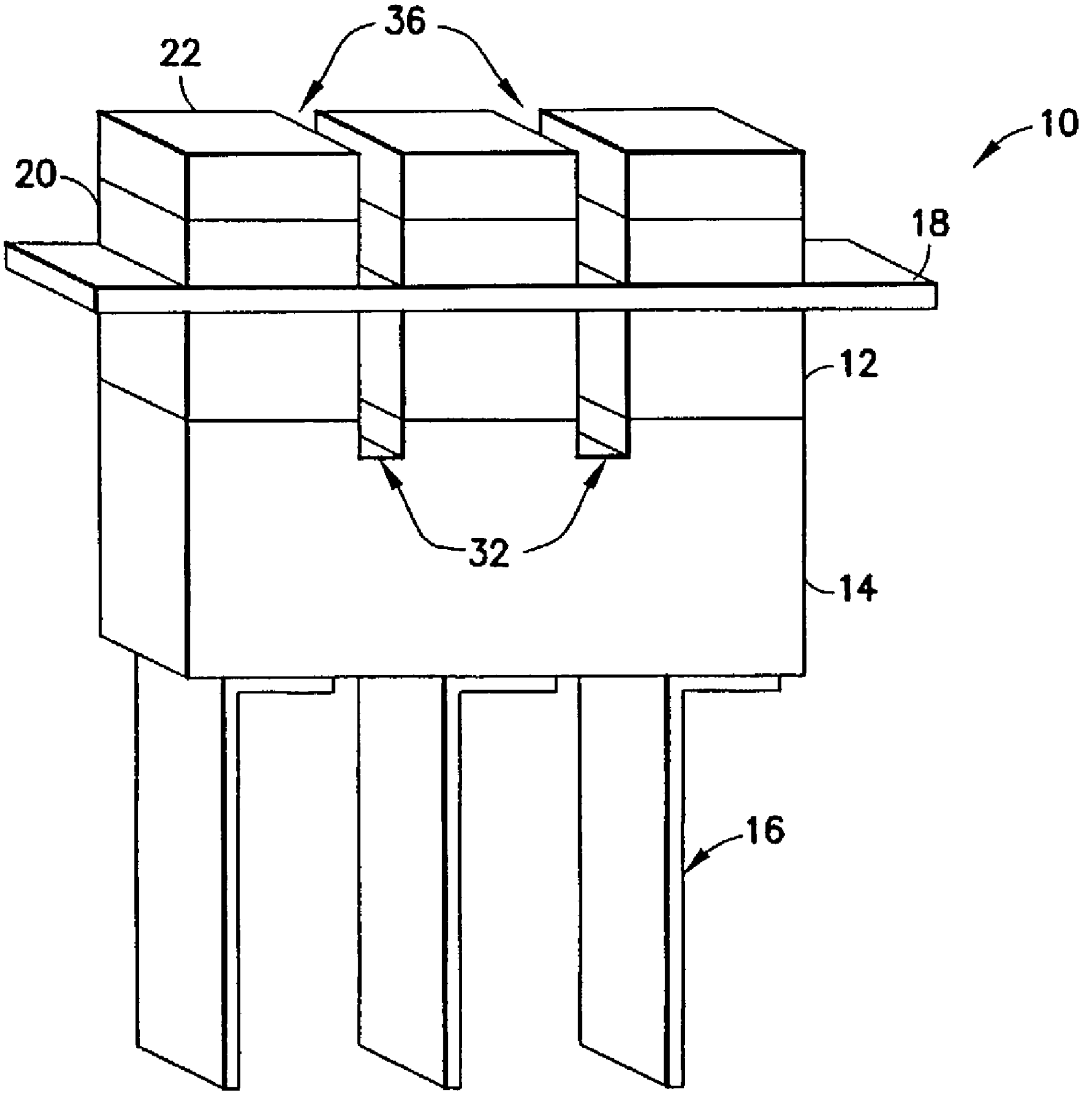
FIG. 1 is a drawing showing an isometric view of one column of a three-row transducer array having a construction in accordance with one embodiment of the invention.
Figure 2:
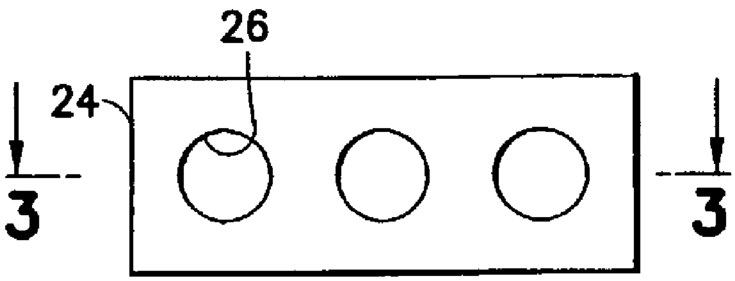
FIGS. 2–7 are drawings showing respective steps in the method of manufacture in accordance with one embodiment of the invention.
Figure 3:
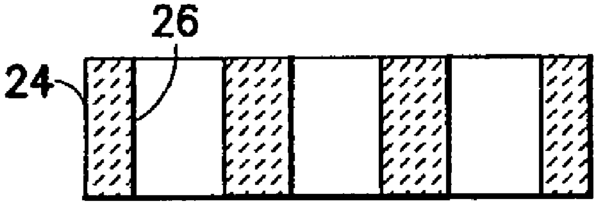

FIG. 1 depicts one column of a three-row transducer array 10 having a construction in accordance with one embodiment of the invention. Each transducer element 12 is joined at its rear face to an acoustic backing layer 14 made of acoustically attenuative material. The transducer elements are preferably made of piezoelectric ceramic material. The acoustic backing layer in turn has a plurality of flexible printed circuit boards ("flex circuits") joined to its rear face, one flex circuit for each row of transducer elements. Only one transducer element from each row has been shown in FIG. 1, along with corresponding portions of the acoustic backing layer and the flex circuits. However, it should be understood that both the acoustic backing layer 14 and the flex circuits 16 extend the full width of each row of transducer elements.

Each transducer element 12 in the array 10 is acoustically coupled to the acoustic backing layer 14. The rows of transducer elements are electrically connected to respective flex circuits 16 via electrical conductors (not shown in FIG. 1) embedded in and passing through the acoustic backing layer 14 in the thickness direction. Each transducer element 12 in a given row is electrically connected to a respective conductive trace (or conductive pad formed at the end of each conductive trace) on the corresponding flex circuit. The conductive trace may be printed on a flexible substrate in conventional fashion. The substrate may consist of a dielectric material such as polyimide. Each conductive trace (or a conductive pad at the end of the conductive trace) is in electrical contact with the rearward termination of a respective electrical conductor in the acoustic backing layer 14. Each transducer element 12 has a signal electrode (not shown) on its rear face that is in electrical contact with the forward termination of the respective electrical conductor in the acoustic backing layer. In conventional fashion, the signal electrodes may be formed by depositing metal on the rear face of a layer of piezoelectric ceramic material and then dicing the piezoelectric ceramic material to form the transducer elements. This dicing operation produces mutually parallel kerfs 32 that separate adjacent rows of transducer elements and that penetrate into a top portion of the acoustic backing layer, as will be described in more detail later.

After the foregoing dicing operation, a ground connection 18 is placed onto the metallized tops of the piezoelectric transducer elements 12. One embodiment of this is to plate a thin (e.g., 2–4 microns) metal layer onto an inner acoustic impedance matching layer 20 and then laminate the latter to the front face of the piezoelectric layer. A second acoustic impedance matching layer 22 is laminated to the first acoustic impedance matching layer 20. Layers 20 and 22 are then diced in the same planes that the piezoelectric layer was diced, thereby forming kerfs 36 that are generally coplanar with kerfs 32. The dicing of layer 20 stops short of the ground metallization 18. In this way the elements in a column are acoustically separated from one another, but electrically connected via the ground metallization.

In accordance with one embodiment of the present invention, the electrical conductors connecting the transducer array to the flex circuits via the acoustic backing layer comprise: (1) respective conductive pads deposited on the front face of the acoustic backing layer and in electrical contact with respective signal electrodes on respective transducer elements; and (2) respective conductive traces connected to respective conductive pads and deposited inside respective vias or throughholes formed in the acoustic backing layer. Each via is subsequently filled with acoustically attenuative material. Optionally, the electrical conductors of the acoustic backing layer may further comprise respective conductive pads deposited on the rear face of the acoustic backing layer and in electrical contact with respective conductive pads or traces printed on flex circuits (one flex circuit for each row of transducer elements).

Thus, the electrical path is from the flex circuit 16 to the conductive trace in the backing layer 14, and then to the signal electrode on the rear face of the transducer element 12. The metallized front faces of the transducer elements are connected to the ground metallization 18, which is common to all elements. The forward acoustic path is from the ceramic elements 12 through the ground metal layer 18 to the acoustic matching layers 20 and 22, and then into the lens or facing (not shown) for the transducer. The reverse acoustic path is for the energy to get trapped by the acoustic backing layer 14.

The method of manufacturing the acoustic backing layer in accordance with one embodiment of the invention will now be described with reference to FIGS. 2–7. The method starts with a layer 24 of acoustic backing material. In the first step, a preform is prepared by forming an array of spaced holes 26 that pass all the way through the thickness of the layer 24. An example of this can be seen in FIGS. 2 and 3. For the sake of simplicity, one row of three holes is shown, but it should be understood that an array of holes will be formed in the perform. One or more holes will be formed for each transducer element in the final transducer array. One face of the preform will eventually be placed against and joined to the transducer array. That face will be referred to herein as the "front face". The holes 26 may be arrayed in the same pattern as the pattern governing the transducer array. The acoustic backing material itself may be homogeneous in composition or, more commonly, may be a homogeneous mixture of several materials possessing different acoustic properties.

The preform, consisting of a layer 24 of acoustic backing material plus holes 26, may be made by any of several techniques. For example, the preform may be formed from a solid piece of acoustic backing material by mechanical or laser drilling of the holes. Conversely, the preform may be formed by casting the acoustic backing material over a mold that contains columns. Once removed from the mold, the mold columns form holes 26 in the cast acoustic backing material 24. The mold columns may be tapered to assist in removal of the cast material from the mold.

Figure 4:
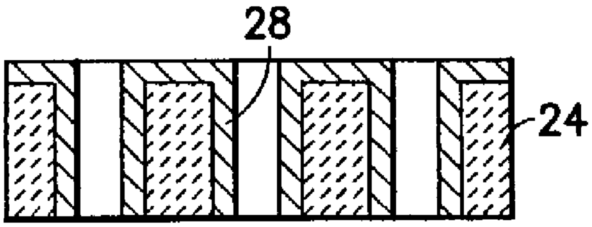

After the backing layer preform has been prepared, a layer 28 of electrically conductive material is deposited on the front face of the preform and on the interior surfaces of the holes 26, as seen in FIG. 4. The resulting conductive film 28 is sufficiently thin so as to not interfere with the acoustic coupling of rearwardly propagating ultrasound waves from the piezoelectric elements into the acoustic backing material. The conductive film 28 is also thin relative to the radius of the preform array holes. The conductive material is preferably a metal but may also be any other material that possesses sufficient electrical conductivity, such as inorganic or organic conductors. The deposited electrically conductive material 28 covers at least the front face of the backing material 24 and is deposited inside the holes 26 that pass through the body of the acoustic backing material. Deposition may be accomplished by any of several common techniques, such as electroless plating, evaporation, vapor deposition, or solution coating.

A variation for preparing the conductive array of holes in the acoustic backing material is to prepare the form for casting the acoustic backing material as described above. A thin layer of electrically conductive material is deposited onto the form prior to casting of the acoustic backing material. After the backing material has hardened, the form is removed by heating or dissolving, thereby leaving behind the acoustic backing material and the attached conductive coating. The conductive film need not be limited to only one face of the acoustic backing material. However, it is preferred that at least the front face of the acoustic backing material be electrically conducting for optimal electrical coupling to the signal electrodes of the piezoelectric transducer elements.

Figure 5:
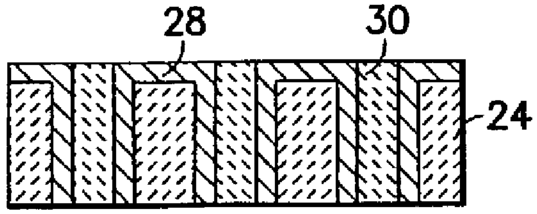

Once the acoustic backing material possesses electrical connectivity through each of the array holes, additional acoustic backing material 30 is used to fill the remaining openings in the acoustic backing preform, as shown in FIG. 5. The composition of the acoustic backing material used to fill these holes is preferably the same as used to prepare the initial acoustic backing material preform. However, the composition of the fill material can be different than the composition of the starting acoustic backing material in order to modify the acoustic signal.

The final product is an acoustic backing material in which a substantial volume is acoustically attenuative material so as to allow for optimal transducer design. However, the acoustic backing material also possesses an array of conductive material deposited over one face, to provide for minimal contact resistance with the transducer array interface, and possesses electrical connectivity through the thickness to provide for electrical contact to electrical circuitry mounted to the other face.

The next operation is to mount the acoustic backing layer onto the back face of a piezoelectric layer and then dice the resulting laminate through the total thickness of the latter and through only a top portion of the thickness of the formed using a dicing saw. Preferably this is done in one dicing operation, although this is not necessary and the top portion of the acoustic backing layer could be diced before being laminated to the piezoelectric layer.

Figure 6:
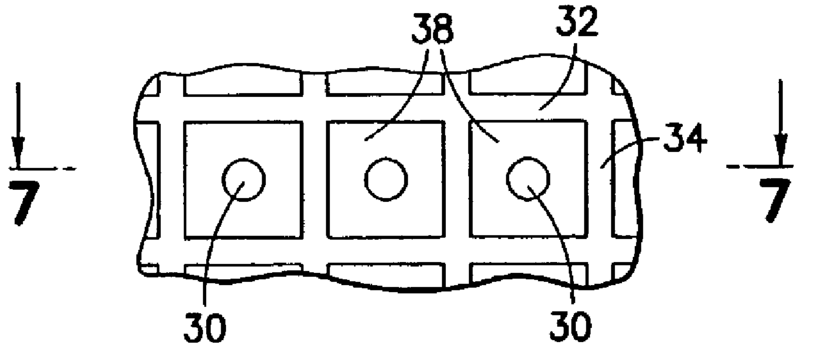
Figure 7:
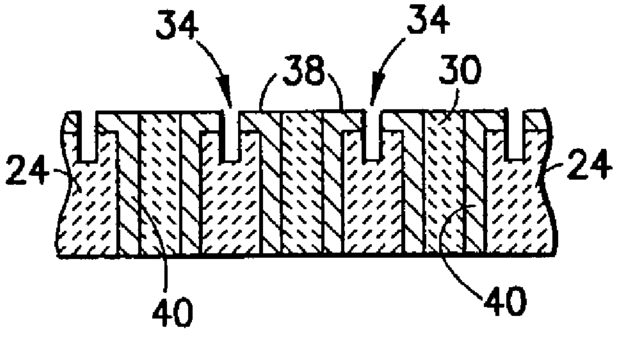

A top view of the acoustic backing layer after dicing in mutually orthogonal directions can be seen in FIG. 6. A first plurality of mutually parallel kerfs 32, made during one dicing operation, subdivide the piezoelectric layer into columns, whereas a second plurality of mutually parallel kerfs 34, orthogonal to kerfs 32 and made during another dicing operation, subdivide the piezoelectric layer into rows, the result being an array of electrically and acoustically isolated transducer elements arranged in rows and columns. The kerfs 32 and 34 are spaced so that a respective transducer element is formed for each via in the acoustic backing layer. In other words, the transducer array is arranged to allow each transducer array element to be electrically connected to the acoustic backing material, with a respective metallized and filled throughhole or via connected to each transducer element. The metallized face of the acoustic backing material is separated into discrete elements coincident with the transducer elements by physically cutting through the conductive layer deposited on the acoustic backing material front face during dicing, as indicated by kerfs 34 in FIG. 7. The dicing of the metallized front face of the acoustic backing layer need not penetrate deep into the backing material, but must be sufficiently deep to electrically and acoustically isolate one transducer element from another.

In the case of mutually orthogonal straight kerfs as shown in FIG. 6, conductive pads 38 of electrically conductive material 28 are formed on the front face of the acoustic backing material. The outer periphery of each conductive pad 38 is generally rectangular, while the inner periphery of the conductive pad is generally circular. The inner periphery of each conductive pad 38 is connected to the top end of the corresponding conductive trace 40 (see FIG. 7) formed by depositing electrically conductive material in the holes in the backing layer.

Connection to the exposed ends of the conductive traces 40 on the back side of the acoustic backing material array holes thereby provides electrical connection to each transducer element in the multi-row array. Connection can be through any of several common methods, such as the use of a multilayer flex circuit or other direct metallization method.

Figure 8:
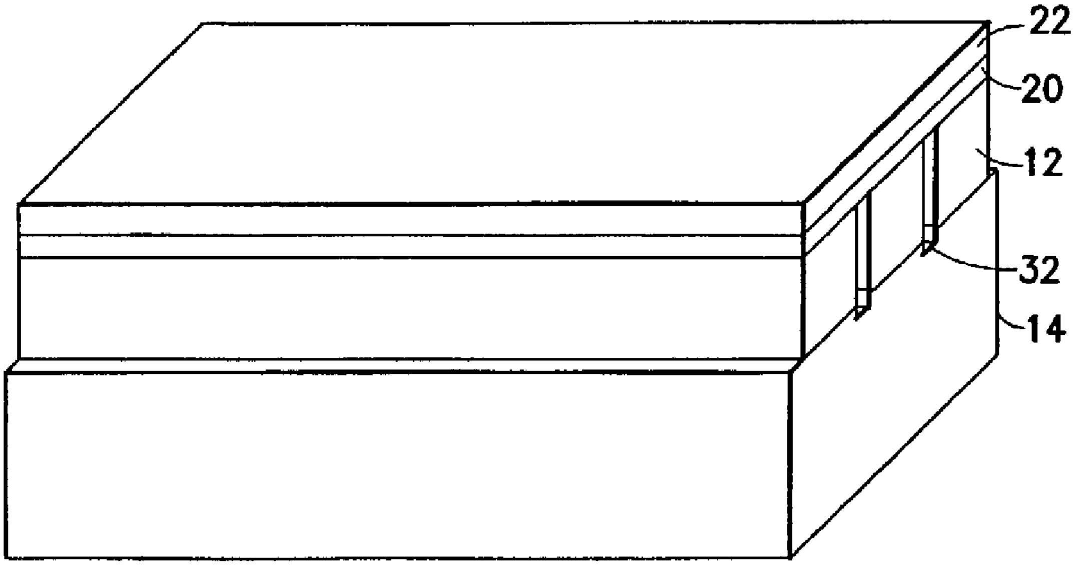
FIG. 8 is a drawing showing an isometric view of a transducer pallet at a stage of manufacture wherein acoustic impedance matching layers have been laminated to the front face of a piezoelectric layer whose rear face is laminated to an acoustic backing layer.
Figure 9:
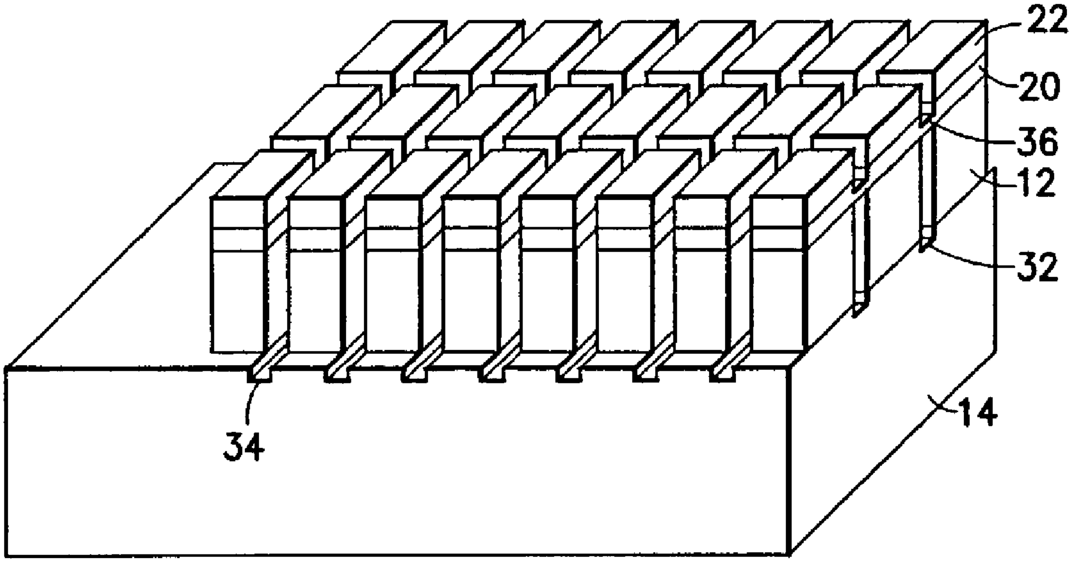
FIG. 9 is a drawing showing an isometric view of the transducer pallet depicted in FIG. 8 after further dicing operations.

The lamination and dicing of the various layers of the transducer pallet is shown in FIGS. 8 and 9. The piezoelectric layer 12 is typically lead zirconate titanate (PZT), polyvinylidene difluoride, or PZT ceramic/polymer composite. Typically, the piezoelectric ceramic material of each transducer element has a signal electrode formed on its rear face and a ground electrode formed on its forward face. The transducer pallet also comprises a mass 14 of suitable acoustical damping material having high acoustic losses, e.g., a mixture of epoxy, silicone rubber and tungsten particles, positioned at the back surface of the transducer element array. This backing layer 14 is coupled to the rear surface of the transducer elements to absorb ultrasonic waves that emerge from the back side of each element, so that they will not be partially reflected and interfere with the ultrasonic waves propagating in the forward direction. Typically, each transducer array element also comprises a first acoustic impedance matching layer 20, which is bonded to the metallized front face (which metallization forms the ground electrode) of the piezoelectric layer 12. A second acoustic impedance matching layer 22 is bonded to the first acoustic impedance matching layer 20. Layers 12, 20 and 22 in the transducer pallet are bonded using acoustically transparent thin layers of adhesive. The acoustic impedance of the second matching layer 22 must be less than the acoustic impedance of the first matching layer 20 and greater than the acoustic impedance of the medium acoustically coupled to the transducer array.

FIG. 8 shows the pallet that results from the following steps: The acoustic backing layer 14 is laminated to the piezoelectric layer 12, layers 12 and 14 are diced completely through layer 12 and only partly through layer 14 to form kerfs 32; acoustic impedance matching layer 20 is laminated to the top of the piezoelectric layer 12; and then acoustic impedance matching layer 22 is laminated to the top of acoustic impedance matching layer 20. Preferably the rear surface of acoustic matching layer 20 that contacts the piezoelectric layer 12 is metallized to provide the ground connections to the ground electrodes on the front faces of the transducer elements. The kerfs 32 may be left empty or may be filled with a material that has a low shear modulus.

Referring now to FIG. 9, the piezoelectric rows are diced completely through the metallization on the rear face of the piezoelectric layer 12 and the front face of the acoustic backing layer 14 in the elevation dimension to form individual transducer elements and to electrically isolate the conductive contacts (i.e., conductive pads and electrodes) under each individual transducer element. Orthogonal dicing cuts 36 are also made in the azimuth direction in line with the kerfs 32 to mechanically separate the matching layers of each row of elements. The kerfs 36 do not extend completely through the acoustic matching layer 20, thereby leaving continuous strips of the metallized rear surface of the acoustic matching layer 20 across each column of elements in the elevation dimension. Thus, the ground electrodes in all rows of transducer elements can be connected to a common ground from either elevational side of the transducer array.

After dicing, the front face of the second acoustic impedance matching layer 22 is conventionally bonded to the planar rear face of a convex cylindrical lens (e.g., made of silicone rubber) using an acoustically transparent thin layer of silicone adhesive.

The conductive pads on the front face of the acoustic backing layer may be laminated to the signal electrodes of the transducer array using high pressure and a thin layer of non-conductive epoxy. If the opposing surfaces of the acoustic backing material and the piezoelectric ceramic material are microscopically rough and the epoxy layer is sufficiently thin, then an electrical connection is achieved via a distribution of direct contacts between high points on the ceramic and high points on the acoustic backing layer.

An ultrasonic transducer array can be electrically connected to conductive traces on a flex circuit using the acoustic backing construction disclosed above. The latter can also be used to electrically connect an ultrasonic transducer array to other electrical conductor arrangements, such as inflexible printed circuit boards, wires, cables, and so forth.

While the invention has been described with reference to preferred embodiments, it will be understood by those skilled in the art that various changes may be made and equivalents may be substituted for elements thereof without departing from the scope of the invention. In addition, many modifications may be made to adapt a particular situation to the teachings of the invention without departing from the essential scope thereof. Therefore it is intended that the invention not be limited to the particular embodiment disclosed as the best mode contemplated for carrying out this invention, but that the invention will include all embodiments falling within the scope of the appended claims.

The invention claimed is:

1. An ultrasonic transducer comprising an array of piezoelectric transducer elements and an acoustic backing layer acoustically coupled to the rear face of each of said piezoelectric transducer elements, said acoustic backing layer comprising a layer of acoustically attenuative material with a plurality of via-shaped internal structures, each of said via-shaped internal structures having a deposit of electrically conductive material thereon and bounding a volume filled with acoustically attenuative material;

wherein said piezoelectric transducer elements and confronting portions of said acoustic backing layer are isolated by a plurality of spaced kerfs disposed parallel to an elevational plane, each piezoelectric transducer element having an electrode on its rear face and each isolated portion of said acoustic backing layer having a conductive pad on its front face, each conductive pad being in contact with a respective electrode.

2. The ultrasonic transducer as recited in claim 1, wherein said piezoelectric transducer elements and confronting portions of said acoustic backing layer are isolated by a grid comprising a first plurality of spaced kerfs disposed parallel to a first elevational plane and a second plurality of spaced kerfs disposed parallel to a second elevational plane substantially orthogonal to said first elevational plane, each piezoelectric transducer element having an electrode on its rear face and each isolated portion of said acoustic backing layer having a conductive pad on its front face, each conductive pad being in contact with a respective electrode.

3. The ultrasonic transducer as recited in claim 1, wherein the acoustically attenuative material filling said bounded volumes and said layer of acoustically attenuative material have substantially the same composition.

4. The ultrasonic transducer as recited in claim 1, wherein each of said piezoelectric transducer elements has an electrode on its front face, said transducer further comprising a thin layer of electrically conductive material in contact with said electrodes on said front faces of said piezoelectric transducer elements and electrically connected to ground.

5. The ultrasonic transducer as recited in claim 4, further comprising a layer of acoustic impedance matching material, wherein said thin layer of electrically conductive material comprises metallization on a surface of said layer of acoustic impedance matching material.

6. An ultrasonic transducer comprising an acoustic backing layer and first and second ultrasonic transducer elements acoustically coupled to said acoustic backing layer and separated from each other by a gap, each of said first and second ultrasonic transducer elements comprising front and rear faces, said rear faces having a deposit of electrically conductive material, and said acoustic backing layer comprising:

a layer of acoustically attenuative material comprising top and bottom surfaces, said top surface of said acoustically attenuative layer confronting said rear faces of said first and second ultrasonic transducer element; and first and second electrical conductors, each of said first and second electrical conductors comprising a respective conductive pad on a respective region of said front surface of said acoustically attenuative layer and a respective conductive trace that is embedded in a respective volume of said acoustically attenuative layer and extends through a thickness of said acoustically attenuative layer, said conductive pads of said first and second electrical conductors being separated from each other by a gap that is substantially coplanar with said gap between said first and second ultrasonic transducer elements.

7. The ultrasonic transducer as recited in claim 6, wherein each of said conductive pads of said first and second electrical conductors covers a respective ring-shaped area having a polygonal outer periphery and a non-polygonal inner periphery, and each of said conductive traces is via-shaped with one end connected to said inner periphery of said conductive pad and another end that is exposed at said bottom surface of said acoustically attenuative layer.

8. The ultrasonic transducer as recited in claim 7, wherein said non-polygonal inner periphery is substantially circular.

9. The ultrasonic transducer as recited in claim 7, wherein said polygonal outer periphery is substantially rectangular.

10. The ultrasonic transducer as recited in claim 6, further comprising third and fourth electrical conductors respectively connected to said exposed ends of said conductive traces of said first and second electrical conductors, and a substrate made of dielectric material supporting said third and fourth electrical conductors.

11. The ultrasonic transducer as recited in claim 10, wherein said substrate is flexible.

12. The ultrasonic transducer as recited in claim 10, wherein said front faces of said first and second ultrasonic transducer elements each have a deposit of electrically conductive material, further comprising a fifth electrical conductor connected to said deposits on said front faces of said first and second ultrasonic transducer elements.

13. The ultrasonic transducer as recited in claim 12, wherein said fifth electrical conductor is connected to ground and said third and fourth electrical conductors are connected to first and second signal sources respectively.

14. The ultrasonic transducer as recited in claim 12, further comprising first and second acoustic impedance matching elements joined to said fifth electrical conductor, said first and second acoustic impedance matching elements respectively overlying said front faces of said first and second ultrasonic transducer elements.

15. An ultrasonic transducer comprising an acoustic backing layer made of acoustically attenuative material, a array of ultrasonic transducer elements that generate ultrasound waves in response to electrical excitation, each ultrasonic transducer element having a rear face acoustically coupled to a respective region of a front face of said acoustic backing layer, a array of acoustic matching layer elements, each ultrasonic transducer element having a front face acoustically coupled to a respective acoustic matching layer element, a common ground connection made of electrically conductive material and disposed between said array of ultrasonic transducer elements and said array of acoustic matching layer elements, and a plurality of electrical conductors that pass through said acoustic backing layer, wherein said front and rear faces of said ultrasonic transducer elements have deposits of electrically conductive material thereon; each of said electrical conductors comprises a respective conductive pad formed on said front face of said acoustic backing layer and in electrical contact with an opposing rear face of a respective ultrasonic transducer element; each of said electrical conductors further comprises a respective conductive trace deposited on a respective via-shaped structure in said acoustic backing layer, connected to a respective one of said conductive pads and exposed at a rear face of said acoustic backing layer; and no part of said common ground connection passes through said acoustic backing material.

16. The ultrasonic transducer as recited in claim 15, wherein said array of ultrasonic transducer elements are arranged in a two-dimensional array with each of said ultrasonic transducer elements being substantially electrically and acoustically isolated from neighboring ultrasonic transducer elements, said plurality of conductive pads being arranged in said two-dimensional array with each of said conductive pads substantially electrically isolated from neighboring conductive pads.

17. The ultrasonic transducer as recited in claim 15, wherein each of said conductive pads has an outer periphery with a shape congruent to a shape of a respective overlapping one of said ultrasonic transducer elements.

* * * * *